United States Patent [19]

Wehner

[11] Patent Number: 4,834,856
[45] Date of Patent: May 30, 1989

[54] METHOD AND APPARATUS FOR SPUTTERING A SUPERCONDUCTOR ONTO A SUBSTRATE

[76] Inventor: Gottfried K. Wehner, 6017 Walnut Dr., Edina, Minn. 55436

[21] Appl. No.: 164,559

[22] Filed: Mar. 7, 1988

Related U.S. Application Data

[63] Continuation-in-part of Ser. No. 146,300, Jan. 21, 1988, abandoned.

[51] Int. Cl.$^4$ .......................... C23C 14/34; B05D 5/12
[52] U.S. Cl. ........................... 204/192.24; 204/192.12; 204/298; 505/816
[58] Field of Search ........... 204/192.1, 192.11, 192.12, 204/192.15, 192.24, 298, 298 TT, 298 TS, 298 TC; 505/816

[56] References Cited

U.S. PATENT DOCUMENTS

| | | | |
|---|---|---|---|
| 3,021,271 | 2/1962 | Wehner | 204/192.3 |
| 3,616,402 | 10/1971 | Kumagai | 204/192.12 |
| 3,649,502 | 3/1972 | Herte et al. | 204/192.12 |
| 3,988,232 | 10/1976 | Wasa et al. | 204/192.18 |

OTHER PUBLICATIONS

R. E. Somekh et al, *Nature*, vol. 326, pp. 857–859 (Apr. 1987).
H. Adachi et al., *Jap. J. Appl. Phys.*, vol. 26, pp. L709–L710 (May 1987).
M. Kawasaki et al., *Jap. J. Appl. Phys.*, vol. 26, pp. L738–L740 (May 1987).

*Primary Examiner*—Aaron Weisstuch
*Attorney, Agent, or Firm*—Hugh D. Jaeger

[57] ABSTRACT

A method for sputter deposition of films or coatings over large areas or at widely different substrate locations relative to the target where the coating is of exactly the same component composition as the target from where the material is being sputtered. This is accomplished by sputtering in a noble gas or other vapor plasma through ion bombarding of at least one spherical or partially spherical target. Superconductors, as well as many other multicomponent materials, can be sputter deposited on a substrate with unchanged composition by utilizing a spherical target in a low gas or vapor pressure plasma.

39 Claims, 4 Drawing Sheets

LARGE SPHERICAL TARGET
SMALL SUBSTRATE DISTANCE

METHOD AND APPARATUS FOR SPUTTERING A SUPERCONDUCTOR ONTO A SUBSTRATE

CROSS REFERENCES TO CO-PENDING APPLICATIONS

This patent application is a continuation-in-part of Ser. No. 146,300, filed Jan. 21, 1988, and now abandoned entitled "Method of Sputtering."

BACKGROUND OF THE INVENTION

1. Field of the Invention

The present invention pertains to sputtering by ion bombardment, deposition of multicomponent films, such as alloy or compound films consisting of two or more elements from the periodic table, and the substrate-target geometry in sputter deposition of a coating. More particularly, the present invention concerns a method for sputter deposition of films or coatings over large areas or at widely different substrate locations relative to the target where the coating is of exactly the same solid component composition as the target from where the material is being sputtered.

2. Description of the Prior Art

The main reason for deviations in a coating composition from that of a flat target is that the various species sputtered from the target have different angular distributions. If one species is for instance preferentially ejected in a direction normal to the target surface, then the law of CONSERVATION OF MASS in a closed system requires that this species must be deficient at another angle of ejection. Integrating the species over all ejection angles from zero (normal ejection) to +/−90 degrees must necessarily add up to the exact target composition. However, this conservation of matter does not apply for volatile gases such as oxygen when they are partly lost into the pump or gettered in other parts of the apparatus.

The angular distribution of the constituents in binary alloys was first studied by the inventor and published in a paper: R. R. Olson and G. K. Wehner, *Journal of Vacuum Science and Technology*, Vol. 14, page 316 (1976), followed by a more detailed later paper; R. R. Olson, M. E. King, and G. K. Wehner in *Journal of Applied Physics*, Vol. 50, page 3677 (1979). The sputtering of multicomponent materials is described in a survey article by Betz and Wehner in *Topics of Applied Physics*, Volume 52, Springer Verlag, N.Y. 1983.

The target geometry played a role in the early attempts in magnetron sputtering where cylindrical, conical and hemispherical targets (in the latter case for sputtering towards the inside of a hemisphere onto a flat substrate) were considered before magnetron sputtering from a planar target was invented, and patented by Chapin in U.S. Pat. No. 4,166,018.

If a flat planar alloy target contains only two metals, one can always find an ejection angle in which the composition is the same as in the target. But this is not usually the case when more than two elements are involved because each species has its own angular distribution and there exists no ejection angle in which all three would come together to form a film with exactly the composition as that of the target. Furthermore, to be restricted in substrate location relative to the target is highly impractical. Another complication with a planar target is the fact that the angular distributions of different species change with the bombarding ion energy.

The present invention overcomes the disadvantages of the prior art by not sputtering from a flat, but from at least one spherical or partially spherical target positioned in a uniform plasma of a triode or diode gas- or vapor-discharge or in a plasma which is created with radio frequency- or microwave-excitation.

SUMMARY OF THE INVENTION

The general purpose of the present invention is the use of a spherical target where the conservation of mass law, together with the spherical symmetry of the target, guarantees that the composition of solids in the deposit is the same as in the target, regardless of where the substrate (within limits) is located. Even if such additional effects, such as evaporation or resputtering from the substrate, or poor sticking of a component becomes involved, the conservation of matter in a spherical-closed system requires that the composition remains unchanged from that of the target, no matter with what ion energy it is sputtered. With a new target, it will require some short presputtering for establishing equilibrium conditions. The surface composition at the target then adjusts automatically to become different from that of the bulk in order to achieve the material removal with unchanged composition. It will, of course, be necessary to keep the target temperature below the value where constituents begin to move in the bulk and diffuse to the surface for replenishing the species which is most easily sputtered from there.

The present invention becomes less useful in a pressure regime where the mean free path of sputtered atoms becomes very short compared to the travel distance between target and substrate. The collisions between sputtered atoms and gas or vapor atoms then make the ejection direction from the target immaterial. But, many considerations exist for operating in the low gas pressure regime ($<10^{-3}$ Torr with mean free paths of the sputtered atoms of several centimeters or larger) such as for retaining the high kinetic energy of sputtered atoms, or preventing the back diffusion of sputtered atoms to the target which lowers the deposition rate, or providing better adherence of those coatings.

Sputtering from a sphere at low gas pressure instead of from a flat target creates another very significant difference, namely with respect to the energies of the impinging atoms because they come not only from normal but as well from obliquely ejected atoms which are known to have higher ejection energies. This improves not only film adherence, compound formation, nucleation, and surface movements of atoms which in turn are beneficial for epitaxy at low substrate temperature.

In oxygen-containing targets or in plasmas 20' or targets which contain other electronegative species, one has to deal with another problem which is related to the fact that many of these atoms 14' are sputtered in the form of negative ions 26'. These are accelerated in the positive ion sheath 24' to the full sputtering voltage in a direction normal to the target surface forming, in the case of a flat target 10' as shown in FIG. 1, a negative ion beam which can resputter the material from a substrate 12' located opposite the flat target. With a spherical target, these ions do not form a beam, but leave the target in radial directions. If all such atoms would leave as negative ions and become imbedded in the deposit, the conservation of matter would even hold for such volatile species as oxygen, etc.

Magnetron sputtering from prior art flat targets, such as in FIG. 1, was invented not only for increasing the deposition rate, but for preventing the target-released electrons from bombarding and heating the substrate. At the spherical target or targets, these electrons are distributed over the whole surrounding volume which eliminates the need for magnetic fields for deflecting these electrons.

The spherical target will even solve problems which arise when a single element target is sputtered in an electronegative gas plasma for producing two component coatings such as metal oxides. The bombarding positive oxygen ions are on impact partly converted into negative ions which again form in the case of a flat target a beam normal to the target surface, which is undesirable because they cause resputtering of material from the substrate. With a spherical target, those ions are however accelerated in radial directions and are therefore much diluted.

The present invention is particularly useful for the recently discovered ceramic high Tc superconductor materials.

The teachings of the present invention are also applicable in the following areas:

1. Superconducting compounds such as NbSn, NbTi, NbGe etc., i.e., other than the new ceramic high Tc materials.
2. Semiconductor films such as GaAs, AlGaAs, HgCdTe, etc.
3. Intermetallic compounds for improved corrosion, and wear resistance and greater hardness such as PtCr at the cutting edges of razor blades.
4. $MoS_2$ films for improved lubrication.
5. Cermet films for fabricating coatings with specific sheet resistance.
6. Hard coatings such as SiC, or WC or other metal carbides, borides or silicides.
7. Coatings with desired optical (solar, TiN gold colored) or magnetic properties such as MnBi or CoCr for perpendicular magnetic recording. And many others in which optimized mechanical (wear, hardness, friction, etc.), or optical, or electrical, or magnetic or magnetio-optical properties are desired.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings:

FIG. 2 illustrates an electrically conducting target sphere 10 of the present invention which is held in position and connected to the negative pole or holding stem of the DC-, or in the case of insulator coatings on a metal sphere, of an RF-sputter power supply. The allowed substrate positions are limited to those not in line of sight with the sphere area where the connection is made. The connecting lead or holding stem to the sphere needs, of course, to be insulated from the plasma 20 so that it would not be subject to sputtering, and such is accomplished by insulator tubing 18 and helically wound spacer wire 22. The sphere can be made of the material to be sputtered or can be a metal sphere which is coated with a sufficiently thick layer of the material to be sputtered. The sputtered atoms 14 received by the substrate 12, ion sheath 24, and the electrons and negative ions 26 are also illustrated in FIG. 1.

Figure 1:
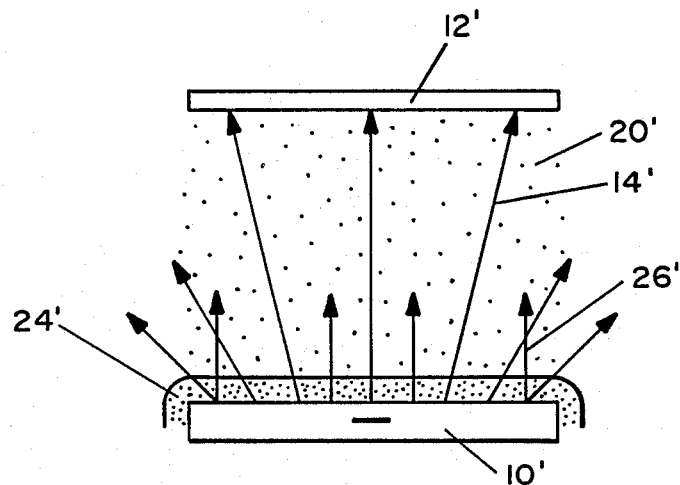
FIG. 1 illustrates prior art sputtering from a flat target.
Figure 2:
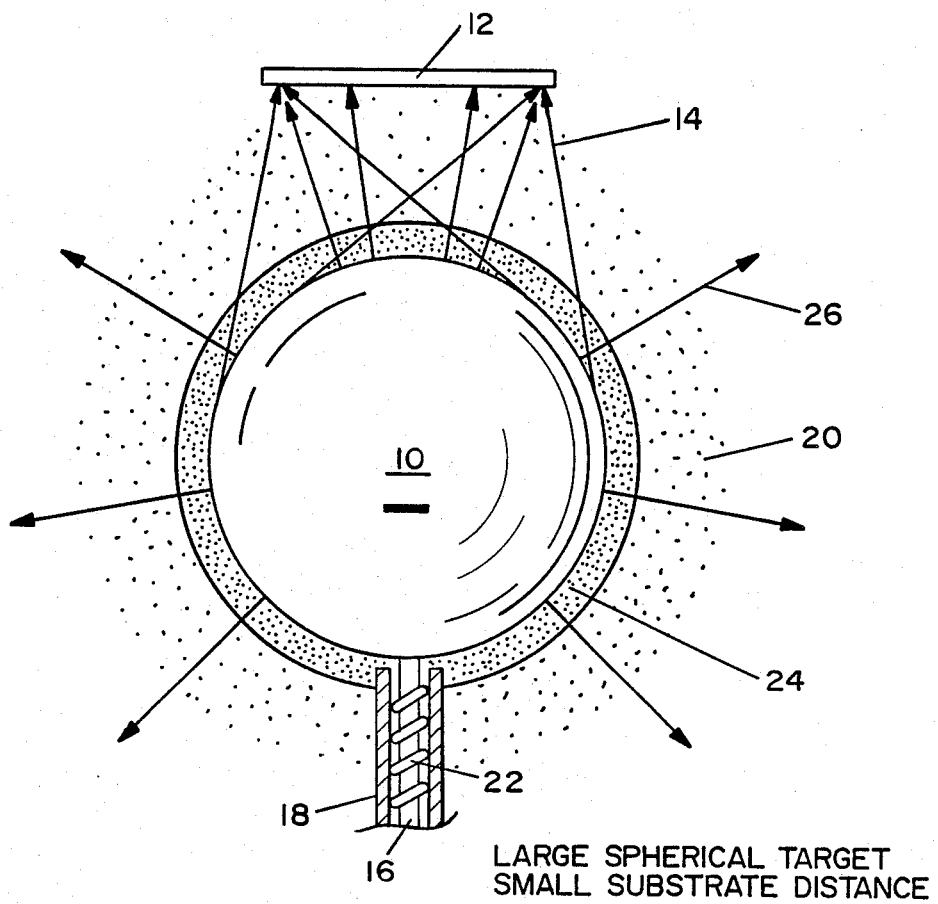
FIG. 2 illustrates the present invention of sputtering from a large spherical target to a substrate.
Figure 3:
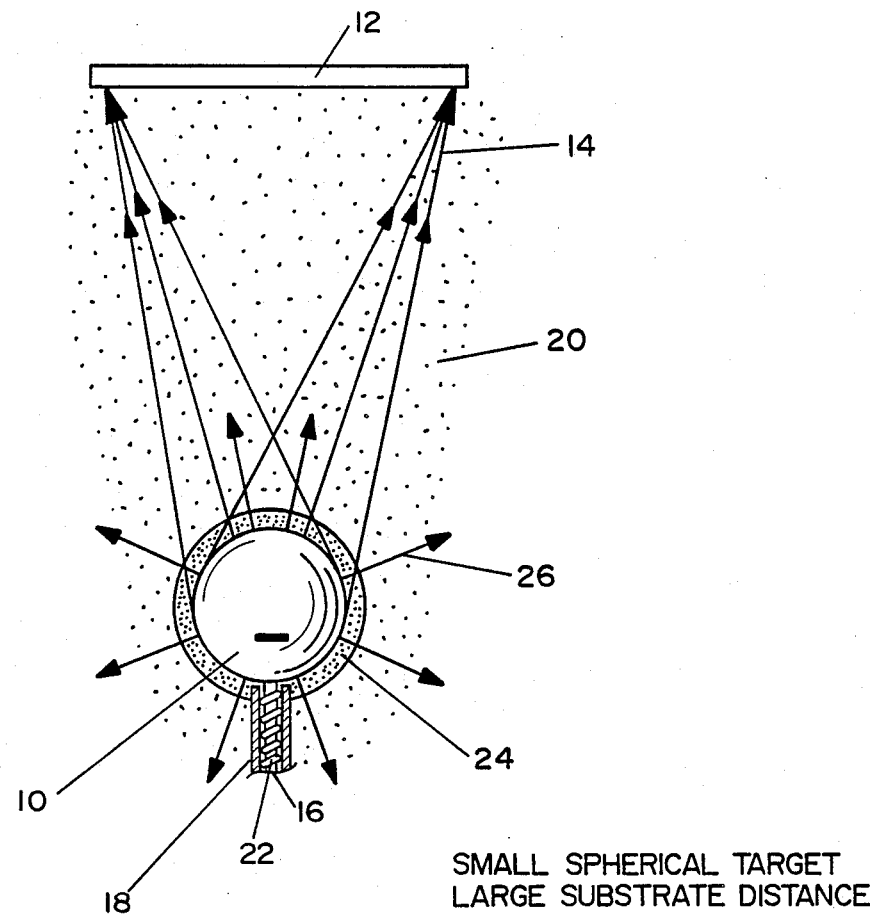
FIG. 3 illustrates the present invention of sputtering from a small spherical target to a substrate; and, FIG. 4 illustrates a resistivity versus absolute temperature graph of a sputter-deposited superconductor film from a 123 target.

The distance between the sphere 10 and the substrate 12 and the sphere size have no influence on the composition, but both affect the deposition rate. The relationship of the target sphere to the substrate must be such that sputtered atoms reach the substrate over the ejection angle range from $-90°$ through 0 to $+90$. The only portion of a sphere that is required is that which provides such an ejection angle range over all parts of the substrate. If one tries to achieve high uniformity of the deposition rate over a flat surface, one should use a small target sphere and a large substrate distance like shown in FIG. 3, but then the deposition rate will become very small. If one uses the case of FIG. 2 with the substrate closer to a large target sphere, it may not only become difficult to fill the space between substrate and target with a dense uniform plasma, but the deposition rate on a flat target becomes more non-uniform unless one uses mechanical motions.

In practical applications, one will most likely seek a compromise in sphere size and distances depending on what is more of a premium, namely the deposition rate or thickness uniformity. A larger sphere is easier to cool which becomes necessary when one aims toward a high sputtering rate of a single sphere. High rates can readily be obtained with a high plasma density such as produced in a Hg triode discharge, and also with a triode noble gas discharge. One can in this case connect tubings to a hole in the target sphere or to a hollow metal sphere which is coated with sufficiently thick deposits of the material to be desired. For simpler cooling without hollowing the sphere one might narrow the allowed substrate locations by using not a full, but less than half a target sphere for the case of FIG. 2, or somewhat more than half a sphere for the case of FIG. 3, and connect these partial spheres to a cooling platform which needs, of course, to be protected from sputtering. The substrate should not be in the line of sight of the location where the support for holding or cooling the spherical target is made.

Sputtering of insulators can only be accomplished with RF power applied to a metal sphere which has the insulating material to be sputtered affixed to the outer surface of the sphere.

The fact that the compositions of the deposits sputtered from spherical targets are maintained independent of substrate positions (within the limits as discussed), and independent of the distance between target and substrate, makes it possible to use more than one plasma-immersed spherical target, in particular in the case that the substrate-target distances are much larger than the target spheres. For tripling, in this case, the deposition rate, and achieving on a flat substrate better deposition rate uniformity, three such spherical targets are arranged in a triangular configuration pointing towards a substrate located in a direction normal to the center of the triangle. Spherical targets can also be arranged in a row for creating a "line source" of sputtered material, such as is usually used with "race track" magnetron sputtering sources for coating large glass panels which are transported continuously across the line source sputtering target. Furthermore, the targets can be arranged in a circle, and a wire or rod to be sputter coated is drawn continuously through the center of the circle. Furthermore, many spherical targets can be positioned in a triangular matrix fashion, or even in a three dimensional configuration, for achieving high deposition rate and high uniformity in thickness over large flat areas. One has only to make sure that each individual sphere is surrounded by a uniform plasma density. As explained above, the places where the sphere holders connect to the spheres should be out of line of sight of the substrates.

MODE OF OPERATION

The immediate impact of the present invention is in the film deposition of the $Y_1Ba_2Cu_3O_{7-x}$ (referred to as 123) ceramic superconductors. These materials are pressed from powders which are mixed in the proper proportions and sintered, and annealed in oxygen at high temperature. Thin films of these materials are usually synthesized by vacuum evaporation or sputtering from two or three sources containing Y, Ba and Cu metals or their compounds. To achieve exactly the 123 composition of the metals in the deposits is not a simple task because it requires flux monitoring for each separate source and the location where one obtains exactly the 123 composition is very limited. Sputtering from a single superconducting 123 target would be much simpler, but has so far not been very successful, at least not for producing 123 films over larger areas in the prior art. In some cases, the desired 123 composition in the deposit can be improved by changing the target composition accordingly.

Figure 4:
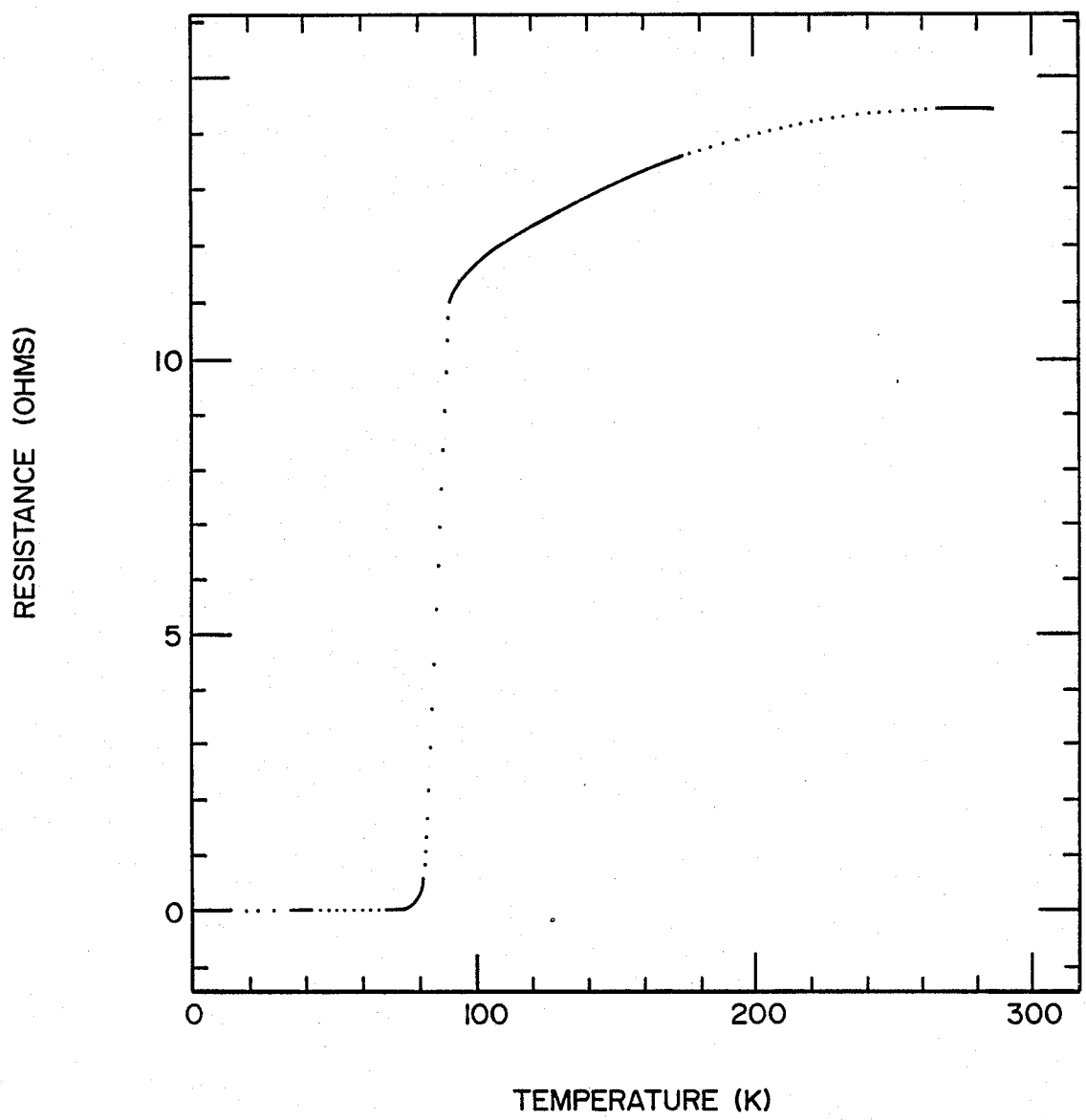

Example: A crude hemisphere of about 4 mm radius was shaped on a grinding wheel out of a 123 disc. A 7000 Å thick film was sputtered from this hemisphere onto a $SrTiO_3$ crystal substrate which was symmetrically opposite the hemispherical target. With a full sphere, the substrate position would have become less restricted. The graph of FIG. 4 illustrates the results.

The present invention was experimentally proven in a mercury triode plasma with the electrons supplied from a cathode spot ignited o a Hg pool. The reason for this plasma was the fact that this equipment was in place and operational, and that the inventor has a long experience in this equipment. The same results will no doubt be obtained in a noble gas triode discharge.

The apparatus is described in U.S. Pat. No. 3,021,271 by Wehner, the applicant. The only change concerns the elimination of grid #16 and the repeller #32 because both would be subject to sputtering, and therefore, add undesired impurity metals. The deposit of FIG. 4 was obtained by replacing the flat target #36 with the hemispherical target of the 123 superconductor pointing with its symmetry axis towards the substrate #34.

The specifics of one example (with the results shown in FIG. 4) of the present invention are as follows: The target hemisphere had a 4 mm radius. The substrate was a $5 \times 6 \times 1$ mm $SrTiO_3$ crystal mounted about 4 cm away from the target. The main discharge current between cathode #22 and anode #30 was 4 amps with a voltage drop between anode and cathode of 25 volts. The lower part of the Pyrex tube was immersed in water which was chilled to 11° C. which sets the vapor pressure of Hg at about $5 \times 10^{-4}$ Torr. The tube was pumped with a 12L/sec Hg diffusion pump. The target voltage was 300 volts negative w.r.t. anode (which is very close to plasma potential), and drew 2mA ion current from the plasma. The floating voltage in this low pressure, very non-thermal, plasma was minus 17 volt w.r.t. anode which of course helps to sputter-clean the insulating substrate before sputter deposition is started. The film was 7000 Å thick and this was obtained in about 11 hours of sputtering.

FIG. 4 shows that the whole resistance curve from 300° K to 92° K curves downward, which differs from most other published data. The $\Delta T$ (10% to 90%) is still rather high. Full superconductivity is reached at 76° K. The sample is an insulator after deposition, and requires the usual oxygen annealing procedure for incorporating the right amount of oxygen. The procedure was: 650° C. for 90 min, 750° C. for 30 min, 850° C. for 20 min and 920° C. for 3.5 min with subsequent slow cooling in oxygen to room temperature.

These films always need such a high temperature heat treatment after deposition for accomplishing the $O_{7-x}$ ($x<1$) composition and for converting the material to the orthorhombic structure.

Various modifications can be made to the present invention without departing from the apparent scope hereof. Whatever new materials with still higher superconductor transition temperatures may be discovered, no matter how complicated in their composition, they can with the present invention readily be transferred from a target to a film on a substrate with unchanged composition over larger areas. Further, the teachings of the present invention apply to spheres which are substantially spherical, such as a partial sphere or a hemisphere.

I claim:

1. The method of sputter-depositing a film or coating from a substantially spherical target comprising the steps of:
    a. immersing a substantially spherical target in a low pressure plasma of uniform plasma density;
    b. providing the substantially spherical target with a metal wire or rod for applying the negative sputtering voltage, carrying the current and for holding it in the low pressure uniform plasma; and,
    c. positioning substrates such that the deposited material consists of atoms which were ejected from the spherical target surface under all possible ejection angles.

2. The method of claim 1 wherein said target is a spherical multicomponent target for replicating the target composition in the deposit.

3. The method of claim 1 comprising the step of immersing said spherical target in a uniform low pressure plasma of a triode discharge.

4. The method of claim 1 comprising the step of making the spherical target the cathode in a low pressure diode discharge.

5. The method of claim 1 comprising the step of immersing the spherical target in a low pressure RF excited plasma.

6. The method of claim 1 comprising the step of immersing the spherical target in a microwave excited plasma.

7. The method of claim 1 comprising the step of using a target comprising a sphere which is coated with the material to be sputtered.

8. The method of claim 7 wherein said target is coated with an insulator and sputtered by applying RF to the metal sphere.

9. The method of claim 1 comprising the step of cooling the target.

10. The method of claim 1 comprising the step of arranging the substrates to be coated so that the surfaces of said substrates always view a part of said spherical target surface which is uniformly bombarded with ions.

11. The method of claim 1 of using more than one spherical target, each of said targets being immersed in a low pressure uniform plasma for increasing the deposition rate and for obtaining upon the surfaces of said substrates a greater deposition thickness uniformity.

12. The method of claim 11 wherein said spherical targets are of at least one high TC superconducting material for sputter-depositing films or coatings.

13. The method of claim 12 wherein said superconductor material is a 123 ceramic superconductor.

14. The method of claim 1 comprising the steps of:
 a. aligning target spheres in a row, all of said spheres being immersed in a low pressure uniform plasma;
 b. separately and simultaneously sputtering onto the substrates; and,
 c. moving said substrates across this "line source" for coting large substrate areas.

15. The method of claim 1 comprising the steps of:
 a. arranging target spheres in a circular fashion for sputtering onto wires or rod substrates; and,
 b. moving said wire or rod substrates through the center of the circle for coating the substrates uniformly.

16. The method of claim 1 comprising the steps of sputtering in a low pressure mercury triode plasma where the electrons for plasma formation are supplied from cathode spots ignited and sustained on a liquid mercury pool.

17. A system for sputtering a multicomponent spherical target for use in sputter deposition on substrates of coatings having the same composition as the target, comprising:
 a. at least one substantially spherical target element comprising a plurality of constituents, which have different angular distributions of emitted particles;
 b. means for positioning said target in a low pressure, uniform plasma; and,
 c. means for positioning substrates such that the deposited material consists of atoms which were ejected from the spherical target surface under all possible ejection angles, whereby the target constituents are deposited on the substrate in the same proportions as said target constituents exist in the target.

18. A system for sputtering the target of claim 17 wherein said plasma is a low pressure mercury triode plasma where the electrons for plasma formation are supplied from cathode spots ignited and sustained on a liquid pool of mercury.

19. A system for sputtering the target of claim 17 wherein said plurality of constituents comprises a superconductor material.

20. A system for sputtering the target of claim 19 wherein said superconductor material is 123 ceramic superconductor material.

21. A system for sputtering a multicomponent superconductor spherical target for use in sputter deposition on a substrate of coatings having the same composition as the targets comprising:
 a. at least one substantially spherical superconductor target which has different angular distributions of emitted atoms;
 b. means for positioning said target in a low pressure, uniform plasma; and,
 c. means for positioning substrates such that the deposited material consists of atoms which were ejected from the spherical target surface under all possible ejection angles, whereby the target superconductor material is deposited on the substrate with a composition which is identical to that of the target.

22. System for sputtering a superconductor material onto a substrate comprising:
 a. a substantially spherical target of a superconductor material;
 b. a substrate positioned such that it faces said target so that the deposited material consists of atoms which were ejected from the spherical target under all possible ejection angles; and,
 c. means for generating a low pressure uniform plasma about said target whereby said target superconductor material is deposited on said substrate with a composition which is identical to that of the target.

23. A multicomponent target used to sputter-deposit on a substrate films or coatings which have the same composition as the target comprising:
 a. a substantially spherical target comprising a plurality of uniformly distributed constituents of a superconductor, which have different angular distributions of emitted particles, said spherical target providing for interception of particles at substrates emitted from tangentially to the surface of said target through particles emitted perpendicular to the surface of said target, whereby the target constituents are deposited on the substrate in the same proportions as said target constituents exist in the target.

24. The method of sputter-depositing a film or coating from a substantially spherical target, comprising the steps of:
 a. immersing a substantially spherical target of at least one high TC superconducting material in a low pressure plasma of uniform plasma density;
 b. providing the substantially spherical target with a metal wire or rod for applying the negative sputtering voltage, carrying the current and for holding it in the uniform plasma; and,
 c. positioning substrates such that the deposited material consists of atoms which were ejected from the spherical target surface under all possible ejection angles.

25. The method of claim 24 wherein said target is a spherical multicomponent target for replicating the target composition in the deposit.

26. The method of claim 24 comprising the step of immersing said spherical target in a uniform low pressure plasma of a triode discharge.

27. The method of claim 24 comprising the step of making the spherical target the cathode in a low pressure diode discharge.

28. The method of claim 24 comprising the step of immersing the spherical target in a low pressure RF excited plasma.

29. The method of claim 24 comprising the step of immersing the spherical target in a microwave excited plasma.

30. The method of claim 24 comprising the step of using a target comprising a sphere which is coated with the material to be sputtered.

31. The method of claim 30 wherein said target is coated with an insulator and sputtered by applying RF to the sphere.

32. The method of claim 24 comprising the step of cooling the target.

33. The method of claim 24 comprising the step of arranging the substrates to be coated so that the surfaces of said substrates always view a part of said spherical target surface which is uniformly bombard with ions.

34. The method of claim 24 of using more than one spherical target, each of said targets being immersed in a low pressure uniform plasma for increasing the deposition rate and for obtaining upon the surfaces of said substrates a greater deposition thickness uniformity.

35. The method of claim 24 comprising the steps of:
   a. aligning target spheres in a row, all of said spheres being immersed in a low pressure plasma;
   b. separately and simultaneously sputtering onto the substrates; and,
   c. moving said substrates across this "line source" for coating large substrate areas.

36. The method of claim 24 comprising the steps of sputtering in a low pressure mercury triode plasma where the electrons for plasma formation are supplied from cathode spots ignited and sustained on a liquid mercury pool.

37. A system for sputting a multicomponent spherical target for use in sputter deposition on substrates of coatings having the same composition as the target comprising:
   a. at least one substantially spherical target element comprising a plurality of superconductor constituents, which have different angular distributions of emitted particles;
   b. means for positioning said target in a low pressure, uniform plasma; and
   c. means for positioning substrates such that the deposited material consists of atoms which were ejected from the spherical target surface under all possible ejection angles, whereby the target constituents are deposited on the substrate in the same proportions as said target constituents exist in the target.

38. The system of claim 37 wherein said plasma is a low pressure mercury triode plasma where the electrons for plasma formation are supplied from cathode spots ignited and sustained on a liquid pool of mercury.

39. The system of claim 37 wherein said superconductor material is 123($Y, Ba_2 Cu_3 O_{7-x}$).

* * * * *